United States Patent
Liu et al.

(10) Patent No.: US 11,329,086 B2
(45) Date of Patent: May 10, 2022

(54) METHOD AND STRUCTURE TO IMPROVE IMAGE SENSOR CROSSTALK

(71) Applicant: OMNIVISION TECHNOLOGIES, INC., Santa Clara, CA (US)

(72) Inventors: Yuanliang Liu, San Jose, CA (US); Bill Phan, San Jose, CA (US); Duli Mao, Sunnyvale, CA (US); Alireza Bonakdar, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 132 days.

(21) Appl. No.: 16/729,176

(22) Filed: Dec. 27, 2019

(65) Prior Publication Data
US 2021/0202546 A1    Jul. 1, 2021

(51) Int. Cl.
*H01L 27/146*    (2006.01)

(52) U.S. Cl.
CPC ...... *H01L 27/1463* (2013.01); *H01L 27/1469* (2013.01); *H01L 27/14621* (2013.01); *H01L 27/14623* (2013.01); *H01L 27/14627* (2013.01); *H01L 27/14636* (2013.01); *H01L 27/14643* (2013.01)

(58) Field of Classification Search
CPC ........... H01L 27/1463; H01L 27/14634; H01L 27/14605; H01L 27/14623; H01L 27/14629
See application file for complete search history.

(56) References Cited

U.S. PATENT DOCUMENTS

| | | | | |
|---|---|---|---|---|
| 8,610,229 B2* | 12/2013 | Hsu | ............. | H01L 27/14685 257/E31.127 |
| 8,941,204 B2* | 1/2015 | Lin | ............. | H01L 27/1463 257/446 |
| 9,041,140 B2* | 5/2015 | JangJian | ............. | H01L 27/1464 257/459 |
| 9,060,144 B2* | 6/2015 | Liu | ............. | H01L 27/14685 |
| 9,202,833 B2* | 12/2015 | Mackey | ............. | H01L 27/14685 |
| 9,443,899 B1 | 9/2016 | Liu et al. | | |
| 9,543,343 B2* | 1/2017 | Chien | ............. | H01L 31/02164 |
| 9,704,904 B2* | 7/2017 | Lai | ............. | H01L 27/14618 |
| 10,134,801 B2* | 11/2018 | Lu | ............. | H01L 27/1463 |
| 10,181,490 B2 | 1/2019 | Watanabe et al. | | |
| 10,319,768 B2* | 6/2019 | Li | ............. | H01L 27/14629 |
| 10,483,310 B2* | 11/2019 | Cheng | ............. | H01L 27/14629 |
| 10,510,788 B2* | 12/2019 | Chou | ............. | H01L 27/14629 |
| 10,665,627 B2* | 5/2020 | Hsu | ............. | H01L 27/14629 |

(Continued)

FOREIGN PATENT DOCUMENTS

KR    20160139266 A  * 12/2016  ............ G01J 1/06

*Primary Examiner* — David A Zarneke
(74) *Attorney, Agent, or Firm* — Christensen O'Connor Johnson Kindness PLLC

(57) ABSTRACT

Image sensors include a substrate material having a plurality of small photodiodes (SPDs) and a plurality of large photodiodes (LPDs) disposed therein. A plurality of pixel isolators is formed in the substrate material, each pixel isolator being disposed between one of the SPDs and one of the LPDs. A passivation layer is disposed on the substrate material and a buffer layer is disposed on the passivation layer. A plurality of first metal elements is disposed in the buffer layer, each first metal element being disposed over one of the pixel isolators, and a plurality of second metal elements is disposed over the plurality of first metal elements.

14 Claims, 14 Drawing Sheets

(56) References Cited

U.S. PATENT DOCUMENTS

| | | | |
|---|---|---|---|
| 10,910,423 B2* | 2/2021 | Nakamoto | H01L 27/14627 |
| 11,075,242 B2* | 7/2021 | Kuo | H01L 27/1464 |
| 2009/0090944 A1* | 4/2009 | Park | H01L 27/14687 |
| | | | 257/292 |
| 2016/0141321 A1* | 5/2016 | Hsieh | H01L 27/14629 |
| | | | 250/216 |
| 2017/0025458 A1* | 1/2017 | Lin | H01L 27/14625 |
| 2018/0308883 A1* | 10/2018 | Yanagita | H04N 5/35563 |
| 2019/0006399 A1 | 1/2019 | Otake et al. | |
| 2019/0198536 A1* | 6/2019 | Wang | H01L 27/14621 |

* cited by examiner

METHOD AND STRUCTURE TO IMPROVE IMAGE SENSOR CROSSTALK

BACKGROUND

This disclosure relates generally to image sensors, in particular to image sensors with split pixel structures.

Image sensors are ubiquitous. They are widely used in digital still cameras, cellular phones, security cameras, as well as, medical, automobile, and other applications. Image sensors with split pixel structures have photodiodes of different sizes, which advantageously enables improved imaging, e.g., High Dynamic Range (HDR) sensing.

BRIEF DESCRIPTION OF THE SEVERAL VIEWS OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Figure 1:
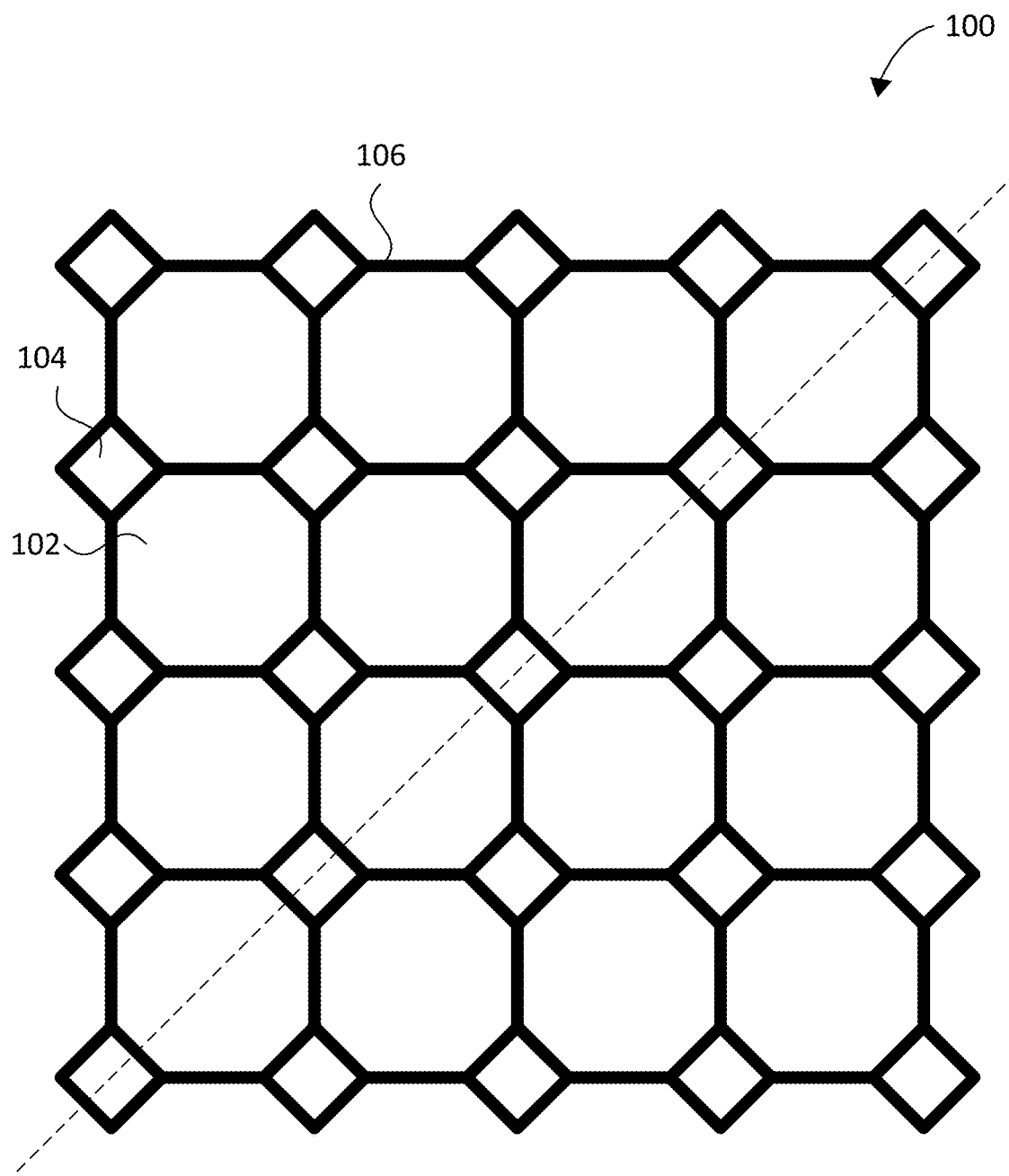
FIG. 1 illustrates a representative image sensor in accordance with the teachings of the present disclosure.

The present disclosure provides image sensors, devices, and methods for manufacturing image sensors. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "an embodiment" or "some embodiments" means that a particular feature, structure, or characteristic described in connection with the embodiment is included in at least one embodiment of the present invention. Thus, the appearances of the phrases "In some embodiments" or "in an embodiment" in various places throughout this specification are not necessarily all referring to the same example. Furthermore, the particular features, structures, or characteristics of embodiments may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

This disclosure refers to a number of terms with respect to different embodiments (including apparatuses and methods). Terms having alike names have alike meanings with respect to different embodiments, except where expressly noted. Similarly, this disclosure utilizes a number of terms of art. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

In the present disclosure, the terms "semiconductor substrate" or "substrate" refer to any type of substrate used for forming semiconductor devices thereon, including single crystal substrates, silicon, silicon-germanium, germanium, gallium arsenide semiconductor on insulator (SOI) substrates, and the combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

In some embodiments, image sensors include one or more color filters and microlenses to filter and focus incident light, respectively. There may be a buffer layer between a substrate including photodiodes and the color filters. The image sensor may include one or more large photodiodes for lower intensity light sensing, and one or more small photodiodes for higher intensity light sensing, e.g., to realize high dynamic range (HDR) sensing. The large photodiodes may be arranged next to and/or surround the small photodiodes. In an embodiment having a large photodiode and a small photodiode, the large photodiode generally has a full well capacity that is greater than a full well capacity of the small photodiode.

In some instances, high angle light (e.g., caused by internal reflections due to high intensity light or other causes) from adjacent large photodiodes may crosstalk over to the small photodiode and be absorbed by the small photodiodes or even saturate the small photodiodes (i.e., optical crosstalk). This can cause deleterious effects on sensing ability of the image sensor for high intensity light, e.g., petal flare.

Image sensors of the present disclosure have an architecture that improves performance of high intensity light sensing in image sensors. A metal grid is provided between the small photodiode and the large photodiode to reduce the amount of high angle light entering the small photodiodes from the proximate large photodiodes, i.e., reducing optical crosstalk. This prevents high angle light crosstalk over from neighboring large photodiodes from activating the small photodiodes. These advantages are especially useful in split pixel structures such as large photodiode/small photodiode (LPD/SPD) image sensors but is also applicable to other pixel structures. Numerous embodiments of representative image sensors are described below. Unless stated otherwise, one or more features of different embodiments may be combined to form additional embodiments that are within the scope of this disclosure.

FIG. 1 shows one example of a representative image sensor 100 in accordance with the teachings of the present disclosure. The image sensor 100 includes an array of large pixels (e.g., large pixel 102) and an array of small pixels (e.g., small pixel 104). The large pixels are laid out in a grid, and the small pixels are disposed between and around the large pixels. Further, image sensor 100 has an LPD/SPD layout, including a plurality of large photodiodes (LPDs) and a plurality of small photodiodes (SPDs). Each LPD is located in one of the large pixels (e.g., large pixel 102), and each SPD is located in one of the small pixels. In the representative and non-limiting example of FIG. 1, the small pixels are square and oriented 45 degrees from the orientation of the grid of large pixels, which are hexagonal. In some embodiments, the small pixels and/or the large pixels have a different shape and/or size than shown in FIG. 1.

Both the small pixels and the large pixels are surrounded by a metal grid 106, which is comprised of plurality of first metal elements and a plurality of second metal elements, which are described below in detail. The metal grid 106 improves the isolation of the SPDs and the LPDs by reflecting or absorbing incident light having high angle light as well as enhancing light sensitivity of the LPDs. In FIG. 1, the image sensor 100 has a 4×4 array of large pixels and a 5×5 array of small pixels; however, in other embodiments the image sensor 100 may have an array of any size. The concepts described herein apply to other pixel and photodiode layouts where separation of photodiodes is advantageous, not just those having LPDs and SPDs.

Figure 2:
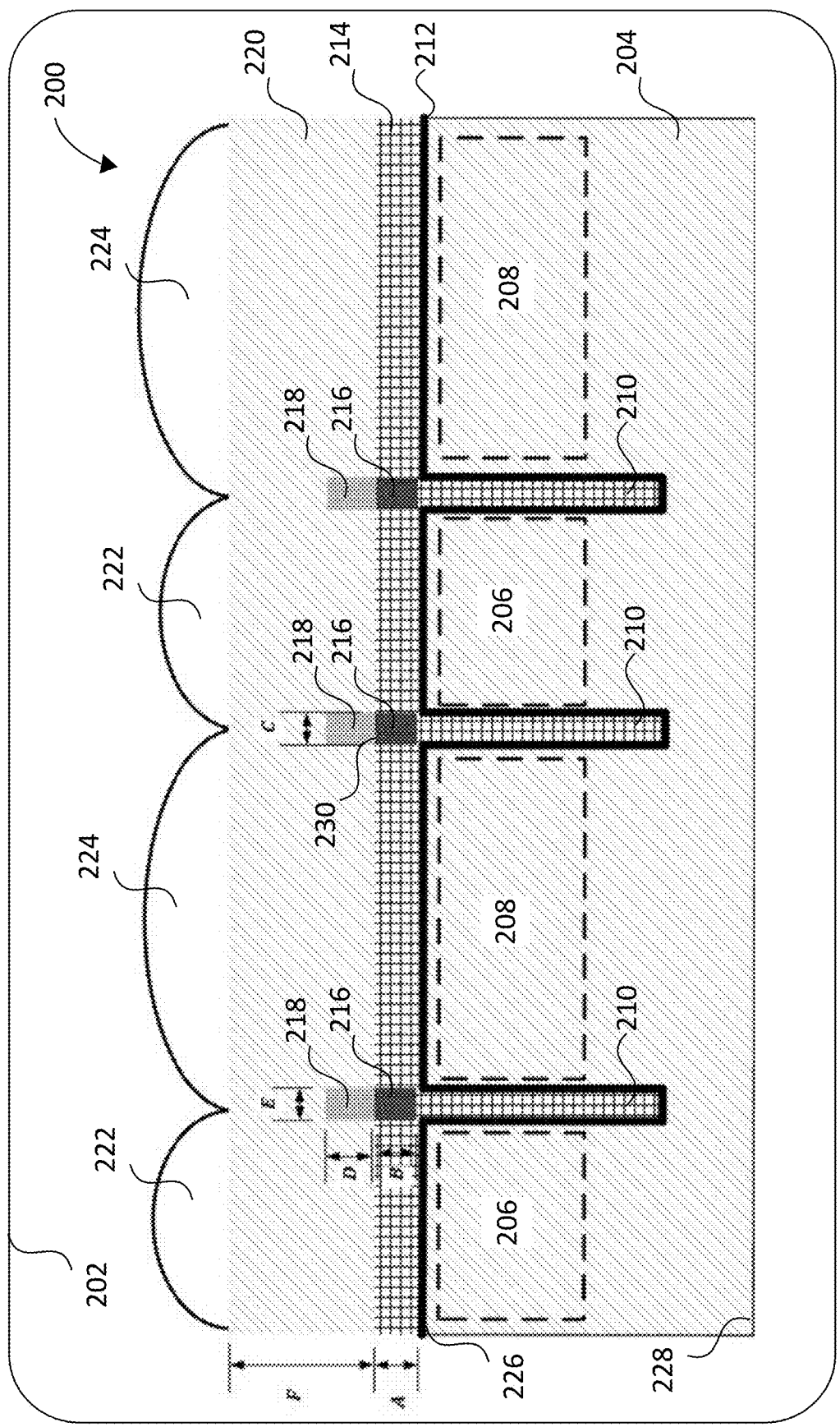
FIG. 2 illustrates an example cross section view of a representative image sensor in accordance with the teachings of the present disclosure.

FIG. 2 illustrates one example of a representative image sensor 200 according to the teachings of the present disclosure. The image sensor 200 is embodied in a device 202, e.g., a camera, a smartphone camera, a vehicle camera, etc. The image sensor 200 includes a substrate material 204 having a plurality of small photodiodes (SPDs) such as SPDs 206, and a plurality of large photodiodes (LPDs) such as LPDs 208. Image sensor 200 also includes a plurality of pixel isolators 210 formed in the substrate material 204, each pixel isolator 210 being disposed between one of the SPDs 206 and one of the LPDs 208. A passivation layer 212 is disposed on the substrate material 204, and a buffer layer 214 is disposed on the passivation layer 212. A plurality of a first metal elements 216 is disposed above the passivation layer 212 over the pixel isolators 210, and a plurality of second metal elements 218 is disposed at least partially over the second metal elements 218, both reducing pixel crosstalk, as described below. The representative image sensor 200 also includes an optional color filter layer 220 disposed over first metal elements 216 and the second metal elements 218, and an optional array of microlenses disposed over the SPDs 206 and LPDs 208, including small microlenses 222 and large microlenses 224.

Substrate material 204 is a semiconductor substrate, such as silicon substrate, a doped silicon substrate, such as n-type doped silicon substrate or p-type doped substrate, a silicon on insulator substrate, or the like. Substrate material 204 has a back side 226 and an opposite front side 228. In FIG. 2, image sensor 200 is configured to receive incident light through the back side 226. Thus, the back side 226 may be referred as an illuminated side of image sensor 200, and the front side 228 may be referred to as a non-illuminated side of image sensor 200.

SPDs 206 and LPDs 208 convert incident light into electrical charge. As used herein, each LPD 208 has a larger full well capacity than each SPD 206. SPDs 206 and LPDs 208 may be formed in the substrate material 204, for example by ion implantation on the front side 228. In some embodiments, SPDs 206 and LPDs 208 are n-type photodiodes formed in a p-type silicon substrate material 204. In some embodiments, the polarity may be reversed; for example, SPDs 206 and LPDs 208 are p-type photodiodes formed in an n-type silicon substrate material 204. LPDs 208 each have a full well capacity that is greater than a full well capacity of each SPD 206, i.e., each LPD 208 stores more photo-generated charges than each SPD 206. In some embodiments, each LPD 208 has a pixel size that is at least twice the pixel size of each SPD 206. In some embodiments, each LPD 208 has a larger light exposure area than each SPD 206. In some embodiments, each SPD 206 is surrounded by two or more LPDs 208. Each SPD 206 need not have the same full well capacity, pixel size, or light exposure area as every other SPD 206. Likewise, each LPD 208 need not have the same full well capacity, pixel size, or light exposure area as every other LPD 208. In some embodiments, a quantum efficiency of each LPD 208 is between 0.4 to 0.9 for incident light with a wavelength of 530 nm. In some embodiments, a quantum efficiency of each SPD 206 is less than 0.5 for incident light with a wavelength of 530 nm.

In the representative image sensor 200, LPDs 208 have greater light exposure area and higher sensitivity to incident light, and may therefore be configured for lower light intensity sensing. On the other hands, SPDs 206 have less light exposure area and are less sensitive to high intensity light compared to LPDs 208, and therefore are configured for higher light intensity sensing. Utilizing an array of SPDs 206 and LPDs 208 in image sensor 200 advantageously enables high dynamic range (HDR) imaging sensing.

Pixel isolators 210 are formed on the back side 226 of substrate material 204 and extend down (relative to the illustration, the device may be oriented in any direction) from the back side 226 into the substrate material 204. Each pixel isolator 210 is disposed between one of the SPDs 206 and one of the LPDs 208, e.g., to prevent electrical and/or optical crosstalk between adjacent photodiodes. In one embodiment, each pixel isolator 210 is a deep trench isolation (DTI) structure filled with passivation material (such as high k oxide material), dielectric material (such as silicon oxide), reflective metal material, or a combination thereof. In FIG. 2, each pixel isolator 210 is filled with a portion of the passivation layer 212 and the buffer layer 214, which are described below. In some embodiments, each pixel isolator 210 is a shallow trench isolation (STI) trench structure or another trench structure.

Passivation layer 212 is deposited on the back side 226 of substrate material 204 and into the pixel isolators 210. Passivation layer 212 comprises a dielectric material, such as an oxide or high-k material, e.g., a material having a dielectric constant that is greater than about 3.9 (e.g., $Al_2O_3$ or $HfO_2$). In some embodiments, passivation layer 212 has a thickness of about 0.005 um to about 0.10 um, e.g., about 0.01 um to about 0.05 um. In some embodiments, passivation layer 212 contains negative fixed charges forming a hole accumulation layer surrounding pixel isolators 210, which passivate sidewalls and bottom of pixel isolators 210 and prevent defects/traps from forming on the boundary (e.g., silicon-silicon oxide interface) during formation of pixel isolators 210. This prevents trapping electrons and/or holes generating dark current, which could affect the sensitivity of SPDs 206 or LPDs 208. The amount of negative fixed charges contained in the passivation layer 212 or the hole density of the hole accumulation layer formed depend on the high-k material and the thickness of passivation layer 212. In some embodiments, passivation layer 212 is formed of material having refractive index between buffer layer 214 (for example 1.4 for silicon oxide) and substrate material 204 (for example, 3.9 for silicon substrate) and a thickness configured to function as anti-reflective coating to reduce the amount of reflection of incident light and enhancing light absorption of SPDs 206 and LPDs 208.

In some embodiments, a thin oxide layer may be formed between passivation layer 212 and the back side 226 surface, for example by deposition or thermal oxidation, and function as stress-relieving layer between the passivation layer 212 and the silicon surface.

Buffer layer 214 is disposed on the passivation layer 212, i.e., on and above the back side 226 of the substrate material 204. In some embodiments, buffer layer 214 includes a dielectric material such as silicon dioxide, and provides process margin for etching and chemical mechanical polishing processes in order to prevent damage to substrate material 204 and passivation layer 212. For example, the buffer layer 214 helps secure the first metal elements 216, described below. In some embodiments, buffer layer 214 has a thickness A of about 0.025 um to about 1.000 um, e.g., about 0.05 um to about 0.50 um. In some embodiments, the buffer layer 214 has a lower dielectric constant than the passivation layer 212, i.e., the passivation layer 212 has a greater dielectric constant than the buffer layer 214.

The first metal elements 216 and second metal elements 218 together form a metal grid (e.g., the metal grid 106 of FIG. 1). The metal grid is provided between the SPDs 206 and the LPDs 208 in a configuration that reduces the amount of high angle incident light entering (and activating) the SPDs 206 from the proximate LPDs 208. In some embodiments, buffer layer 214 is transparent to incident light, such as light with a high incident angle with respect to a surface normal the back side 226 surface that is directed to LPDs 208. Such high incident angle light may penetrate buffer layer 214 and crosstalk over to SPDs 206 surrounded by the respective LPDs 208, and the metal grid structure formed of the first metal elements 216 and second metal elements 218 may effectively block such high incident angle light from crosstalk over to SPDs 206 and, at the same time, may also improve light absorption of the respective LPDs 208. Thus, the metal grid reduces optical crosstalk and its deleterious effects, e.g., petal flare. In some embodiments, at least a portion of incident light that is oblique to a surface normal of the back side 226 may be reflected by the metal grid structure formed of the first metal elements 216 and the second metal elements 218 into the individual large photodiodes 208 for enhancing light sensitivity of large photodiodes 208.

Each of the first metal elements 216 is formed at least partially from a metal such as aluminum or tungsten, and is disposed at least partially in the buffer layer 214 at least partially over (i.e., above) one of the pixel isolators 210. Restated, each of the first metal elements 216 is disposed at least partially in the buffer layer 214 above and between an adjacent SPD 206 and LPD 208. In FIG. 2, each first metal element 216 is disposed in the buffer layer 214, e.g., entirely in the buffer layer 214. In some embodiments, one or more first metal elements 216 is partially disposed in the buffer layer 214. For example, in some embodiments, one or more first metal elements 216 protrude from buffer layer 214, e.g., from an upper surface of the buffer layer 214. In FIG. 2, each first metal element 216 is disposed directly over one of the pixel isolators 210; however, in some embodiments (described below), each first metal element 216 is shifted laterally such that it is not disposed directly over the corresponding pixel isolator 210. As shown in FIG. 2, in some embodiments, the first metal elements 216 do not extend into the plurality of pixel isolators 210. In some embodiments, the first metal elements 216 and the second metal elements 218 may be shifted laterally to the left or right of the center line of respective pixel isolator 210 depending on its location in the pixel array to accommodate a chief ray angle (CRA) of incident light for better optical crosstalk performance.

Each first metal element 216 has a thickness B and a width C. Thickness B can range from about 0.025 um to about 1.000 um, e.g., about 0.05 um to about 0.50 um. In some embodiments, thickness B corresponds to the thickness A of the buffer layer 214. In some embodiments, thickness B of the first metal element 216 is about 0.005 um to about 0.010 um less than the thickness A of the buffer layer 214, and the upper surface of each first metal element 216 is flush with the upper surface of the buffer layer 214, such that the buffer layer 214 isolates each first metal element 216 from the passivation layer 212 (i.e., first metal elements 216 do not touch passivation layer 212). In some embodiments, an upper surface of each first metal element 216 is flush with an upper surface of buffer layer 214 (for example, as a result of a processing step such as a chemical mechanical processing step described below). Width C is about 0.05 um to about 0.25 um, e.g., about 0.09 um to about 0.20 um. In some embodiments, width C is about the same as, or less than, a width of the corresponding pixel isolator 210 over which the first metal element 216 is disposed. In some embodiments, different first metal elements 216 have different thicknesses B and/or widths C.

Advantageously, by including the first metal elements 216 in the buffer layer 214, as compared to a more distant location relative to the SPDs 206 (e.g., in the color filter layer 220, or more than about 0.05 um to about 0.50 um above the SPDs 206), each first metal element 216 is better positioned to prevent incident light from activating the SPDs 206. Restated, it is difficult for incident light to pass underneath the first metal elements 216 and activate the SPDs 206, which would otherwise saturate the SPDs 206 during integration period of image sensor.

Second metal elements 218 further improve light-blocking capabilities of the metal grid. Similar to the first metal elements 216, second metal elements 218 are each formed at least partially from a metal such as aluminum or tungsten, and are disposed at least partially over (i.e., above) one of the pixel isolators 210 and at least partially over at least one of the first metal elements 216. Restated, a lower surface of each second metal element 218 interfaces at least partially with an upper surface of a first metal element 216 at an interface 230. Advantageously, this prevents incident light from passing between a corresponding first metal element 216 and second metal element 218. Whereas the first metal elements 216 are disposed in the buffer layer 214, the second metal elements 218 are disposed on the first metal elements 216. In FIG. 2, the second metal elements 218 are also disposed on the buffer layer 214, i.e., a lower surface of each second metal element 218 is flush with an upper surface of the buffer layer 214. In FIG. 2, each second metal element 218 is aligned with the first metal element 216 it is disposed upon. In some embodiments, each second metal element 218 is shifted relative to the first metal element 216 it is disposed upon and/or relative to the pixel isolator 210 it is disposed above, for example as a result of overlay shift of photoresist mask or to improve optical crosstalk performance. In some embodiments, one or more second metal elements 218 is formed from a different material than one or more first metal elements 216. In some embodiments, each second metal element 218 is disposed between two or more color filters.

Each second metal element 218 has a thickness D and a width E. Thickness D can range from about 0.050 um to about 1.000 um, e.g., about 0.10 um to about 0.50 um. In some embodiments, thickness D can exceed the thickness B of the first metal elements 216. Width E is about 0.05 um to about 0.25 um, e.g., about 0.09 um to about 0.20 um. In some embodiments, width E is about the same as, or less than, the width C of the corresponding first metal element 216 over which the second metal element 218 is disposed. In some embodiments, width E is about the same as, or less than, a width of the corresponding pixel isolator 210 over which the second metal element 218 is disposed. In some embodiments, different second metal elements 218 have different thicknesses D and/or widths E.

Thus, the first metal elements 216 and second metal elements 218 together collectively form a metal grid that is disposed in the buffer layer 214 and above the buffer layer 214 in a configuration that reduces optical crosstalk.

Optional color filter layer 220 absorbs one or more wavelength ranges of visible light such that one or more photodiodes responds to one or more selected wavelength bands of visible light, e.g., red, green, blue, cyan, magenta, and yellow. In FIG. 2, second metal elements 218 are disposed in color filter layer 220. Color filter layer 220 is shown in FIG. 2 as a layer disposed over and around the second metal elements 218. In some embodiments, color filter layer 220 includes an array of discrete color filters, e.g., small color filters and large color filters, one or more of which may be configured to filter a different wavelength of color than another color filter. In such embodiments, each discrete small color filter may be disposed above and aligned an SPD 206. Likewise, each discrete large color filter may be disposed above and aligned with an LPD 208. In some embodiments, one or more color filters is disposed on the buffer layer 214. In some embodiments, one or more color filters is disposed at least partially in the buffer layer 214. In some embodiments, one or more color filters is disposed in gaps between the plurality of second metal elements 218. Restated, the second metal elements 218 surround the one or more color filters forming buried color filter array. In some embodiments, the array of color filters has a thickness F that is greater than a thickness of the second metal elements 218.

Optional small microlenses 222 and large microlenses 224 gather, direct, and focus incident light on the SPDs 206 and LPDs 208, respectively. Accordingly, each small microlens 222 and each large microlens 224 is formed above and aligned with an SPD 206 and an LPD 208, respectively. For example, small microlens 222 is formed above SPD 206 with each edge aligned to the center of the respective first metal element 216 and second metal element 218 on each side of SPD 206 such that it is configured to direct incident light onto the light exposure area of the SPD 206. Similarly for each large microlens 224. In some embodiments, one or more small microlens 222 and/or large microlens 224 may have a different height, i.e., a distance between the top of microlens and respective color filter in the color filter layer 220. For example, small microlens 222 may have a first height that is less than a second height of large microlens 224, i.e., large microlens 224 is taller than the small microlens 222, e.g., to compensate for curvature differences such that small microlens 222 and large microlens 224 have substantially the same focal length.

Advantageously, the structure of image sensor 200 described above limits the amount of incident light (particularly high-angle incident light) that can activate the SPDs 206, thereby limiting optical crosstalk and improving the performance of image sensor 200, in particular HDR sensing.

Figure 3:
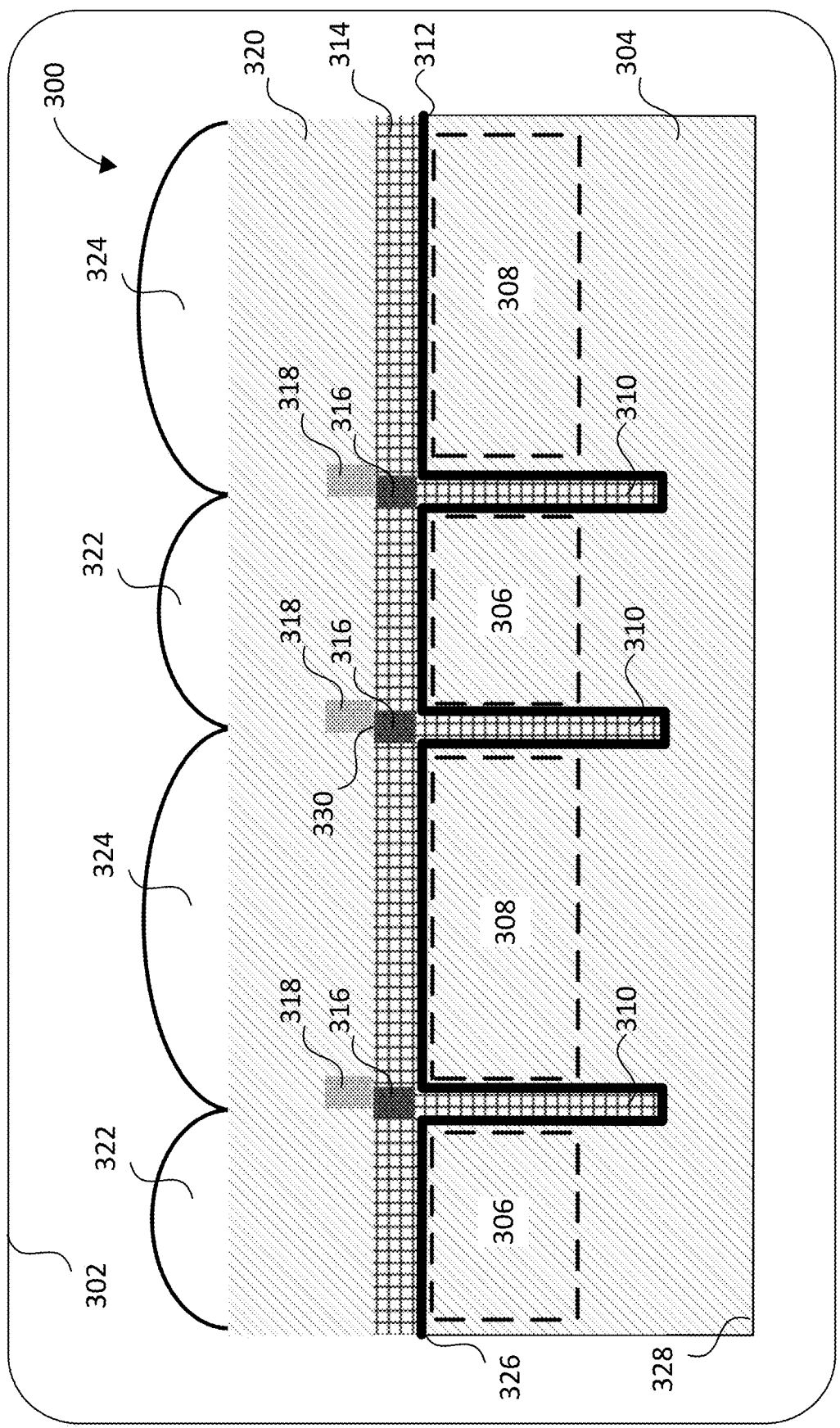
FIG. 3 illustrates an example cross section view of another representative image sensor in accordance with the teachings of the present disclosure.

FIG. 3 illustrates an example of an alternative image sensor 300 embodied in a device 302. Similar to image sensor 200, the image sensor 300 includes a substrate material 304 having SPDs 306 and LPDs 308. Image sensor 300 also includes a plurality of pixel isolators 310 disposed between SPDs 306 and LPDs 308. A passivation layer 312 is disposed on the substrate material 304, and a buffer layer 314 is disposed on the passivation layer 312. A plurality of a first metal elements 316 is disposed in the passivation layer 312 over the pixel isolators 310, and a plurality of second metal elements 318 is disposed at least partially over the second metal elements 318. A color filter layer 320 is disposed over first metal elements 316 and between the second metal elements 318, and small microlenses 222 and large microlenses 224 are disposed over the SPDs 306 and LPDs 308, respectively. Image sensor 300 is configured to receive incident light through a back side 326, and not through front side 328.

Image sensor 300 is substantively similar to image sensor 200 of FIG. 2, except that second metal elements 318 are shifted laterally relative to first metal elements 316, i.e., shifted in a plane parallel to an upper surface of buffer layer 314. This shift improves optical performance of image sensor 300 in certain applications, e.g., due to a refraction angle of incident light. Each second metal element 318 is disposed at least partially over a corresponding first metal element 316, such that a lower surface of each second metal element 318 interfaces at least partially with an upper surface of a first metal element 316 at an interface 330. In some embodiments, one or more edges of small microlenses 322 and/or large microlenses 324 may be shifted as well, e.g., to align edges thereof with the second metal elements 318.

Figure 4:
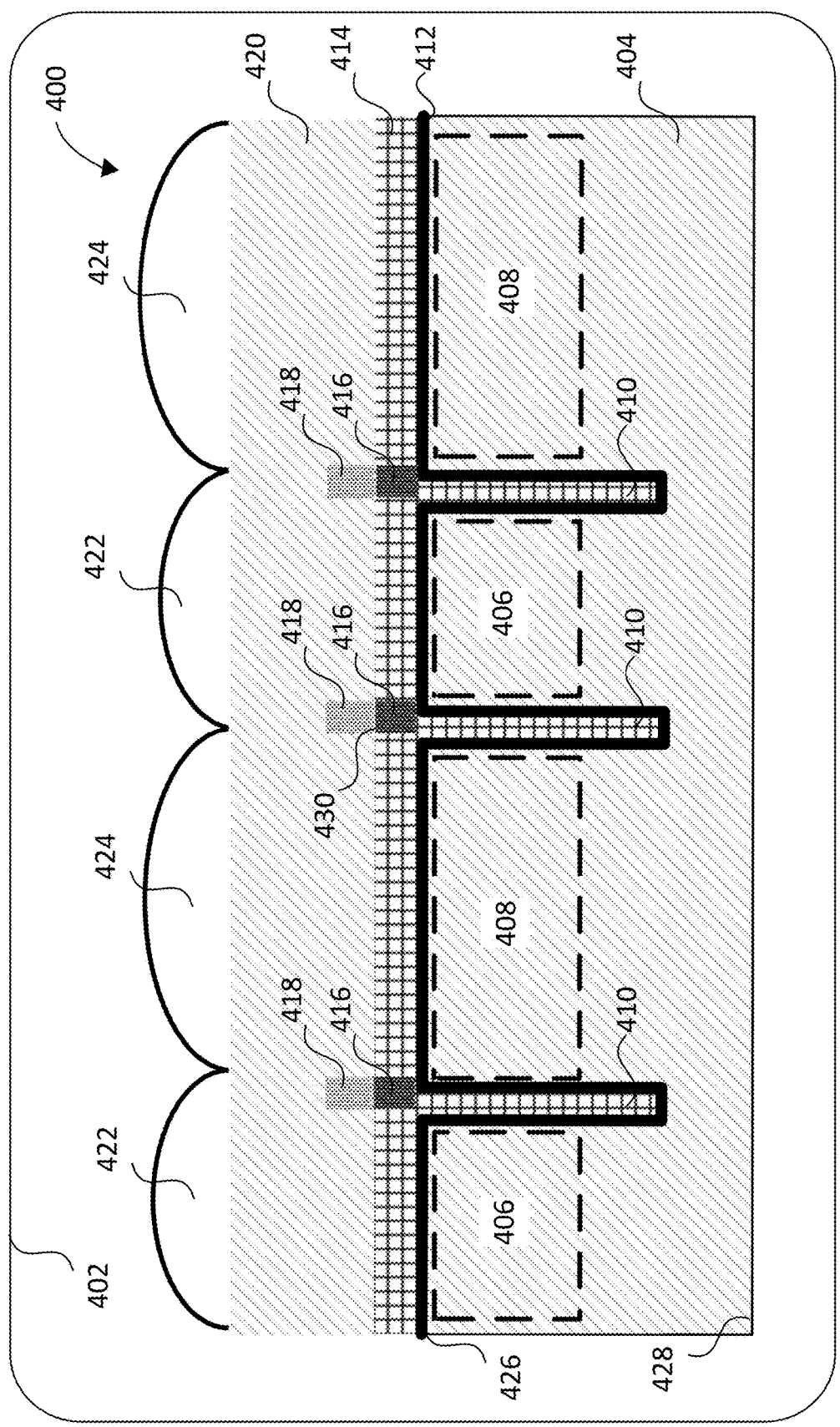
FIG. 4 illustrates an example cross section view of another representative image sensor in accordance with the teachings of the present disclosure.

FIG. 4 illustrates another example of an alternative image sensor 400 embodied in a device 402. Similar to image sensor 200, the image sensor 400 includes a substrate material 404 having SPDs 406 and LPDs 408. Image sensor 400 also includes a plurality of pixel isolators 410 disposed between SPDs 406 and LPDs 408. A passivation layer 412 is disposed on the substrate material 404, and a buffer layer 414 is disposed on the passivation layer 412. A plurality of a first metal elements 416 is disposed in the passivation layer 412 over the pixel isolators 410, and a plurality of second metal elements 418 is disposed at least partially over the second metal elements 418. A color filter layer 420 is disposed over first metal elements 416 and between the second metal elements 418, and small microlenses 222 and large microlenses 224 are disposed over the SPDs 406 and LPDs 408, respectively. Image sensor 400 is configured to receive incident light through a back side 426, and not through front side 428.

Image sensor 400 is substantively similar to image sensor 200 of FIG. 2, except that first metal element 416 and second metal elements 418 are both shifted laterally relative to pixel isolators 410, i.e., shifted in a plane parallel to an upper surface of buffer layer 414. This shift improves optical performance of image sensor 400 in certain applications, e.g., due to a refraction angle of incident light. Each second metal element 418 is disposed directly over a corresponding first metal element 416, such that a lower surface of each second metal element 418 interfaces with an upper surface of a first metal element 416 at an interface 430. In some embodiments, both first metal elements 416 and second metal elements 418 are shifted relative to pixel isolators 410, but by different distances. Thus, in such embodiments, each second metal element 418 overlaps partially with its corresponding first metal element 416 at the interface 430. In FIG. 4, the edges of small microlenses 422 and large microlenses 424 are also shifted relative to pixel isolators 410, in order to align edges thereof with the first metal elements 416 and/or second metal elements 418.

Figure 5:
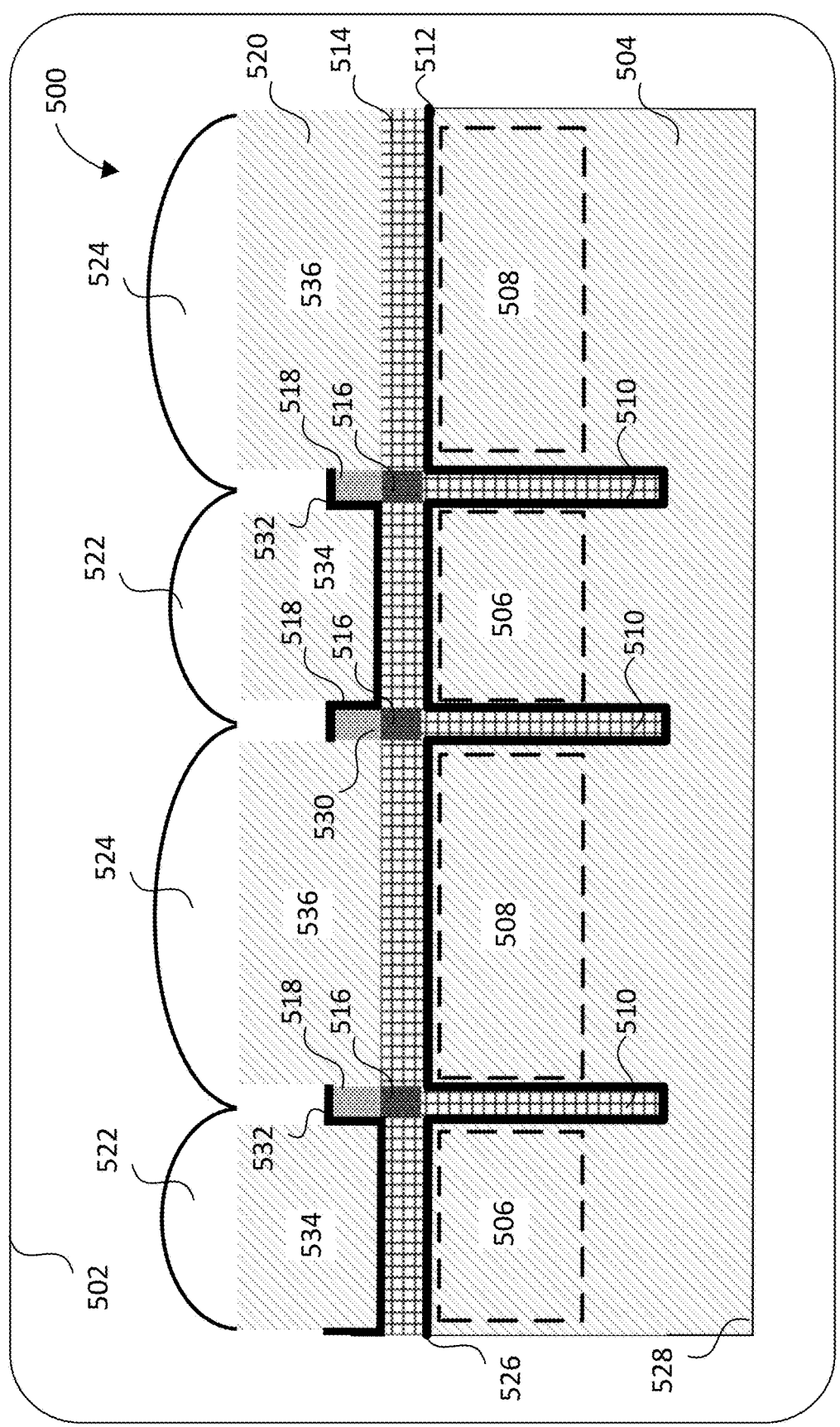
FIG. 5 illustrates an example cross section view of another representative image sensor in accordance with the teachings of the present disclosure.

FIG. 5 illustrates another example of an alternative image sensor 500 embodied in a device 502. Similar to image sensor 200, the image sensor 500 includes a substrate material 504 having SPDs 506 and LPDs 508. Image sensor 500 also includes a plurality of pixel isolators 510 disposed between SPDs 506 and LPDs 508. A passivation layer 512 is disposed on the substrate material 504, and a buffer layer 514 is disposed on the passivation layer 512. A plurality of a first metal elements 516 is disposed in the passivation layer 512 over the pixel isolators 510, and a plurality of second metal elements 518 is disposed at least partially over the second metal elements 518. A color filter array 520 is disposed over first metal elements 516 and between the second metal elements 518, and small microlenses 222 and large microlenses 224 are disposed over the SPDs 506 and LPDs 508, respectively. Image sensor 500 is configured to receive incident light through a back side 526, and not through front side 528. Each second metal element 518 is disposed directly over a corresponding first metal element 516, such that a lower surface of each second metal element 518 interfaces with an upper surface of a first metal element 516 at an interface 530. Further, each first metal element 516 and corresponding second metal element 518 are disposed directly over a corresponding pixel isolator 510. In some embodiments, one or more of the first metal elements 516 and/or second metal elements 518 may be shifted relative to each other and/or relative to the pixel isolators 510, as described above with respect to FIG. 2-FIG. 4.

Image sensor 500 is substantively similar to image sensor 200 of FIG. 2, and further includes an attenuation layer 532 is disposed over each SPD 506 as described below. Also, the color filter array 520 of FIG. 5 clarifies how the color filter layer 220 of FIG. 2 could be formed, i.e., as an array of small color filters 534 and large color filters 536, each of which may be configured to filter a same or different wavelength(s) of incident light.

Attenuation layer 532 is configured to attenuate the light sensitivity of each SPD 506, and is arranged to form and align with SPD 506 to attenuate incident light directed thereto. For example, in some embodiments, attenuation layer 532 is configured to reduce (e.g., through absorption) an amount of incident light reaching SPD 506, thereby preventing SPD 506 from becoming saturated during an integration period. Attenuation layer 532 is formed on buffer layer 514 and second metal elements 518. Further, each attenuation layer 532 is disposed between the buffer layer 514 and the corresponding small color filter 534, e.g., such that the small color filter 534 does not directly contact the buffer layer 514. Attenuation layer 532 may extend in all directions away from SPD 506 in a plane parallel to an upper surface of the buffer layer 514.

Attenuation layer 532 may be single layer or multi-layer stack structure with thickness configured to adjust the transmittance of incident light to the corresponding SPD 506, and may be formed from titanium, titanium nitride, tantalum, aluminum, tungsten, and the like, or a combination thereof. In some embodiments, each attenuation layer 532 covers not only an entire SPD 506, but also a portion of one or more adjacent LPDs 508.

Figure 6:
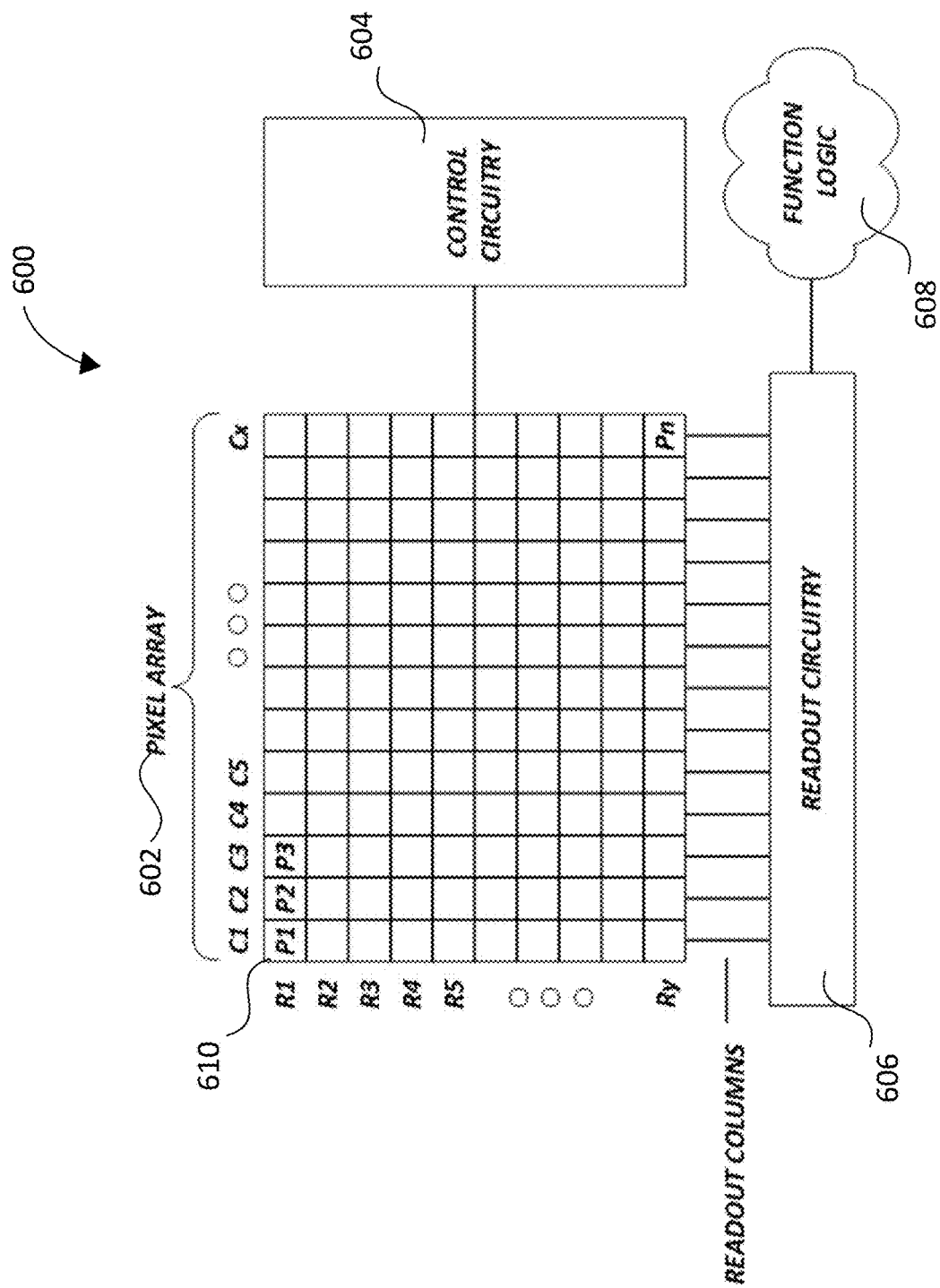
FIG. 6 is a diagram illustrating a representative imaging system having a pixel array in accordance with the teachings of the present disclosure.

FIG. 6 is a diagram illustrating one example of a representative imaging system 600 with a pixel array 602 having a plurality of image sensors formed in accordance with the teachings of the present disclosure. As shown, the pixel array 602 is coupled to a control circuitry 604 and to a readout circuitry 606, which is coupled to a function logic 608.

In one example, pixel array 602 is a two-dimensional ("2D") array of pixels 610 (e.g., pixels P1, P2 . . . , Pn). In one embodiment, each pixel 610 is a complementary metal-oxide-semiconductor ("CMOS") imaging pixel. Pixels 610 may be implemented as either a front side illuminated image sensor array, or a backside illuminated image sensor array. In one embodiment, pixels 610 include one or more image sensors as depicted in FIG. 2-FIG. 5. As illustrated, the pixels 610 are arranged into rows (e.g., rows R1 to Ry) and columns (e.g., column C1 to Cx) to acquire image data of a person, place, or object, which can then be used to render a 2D image of the person, place, or object.

In one embodiment, after a pixel 610 (or pixels 610) has acquired its image data or image charge, the image data is readout by readout circuitry 606 and transferred to function logic 608. Readout circuitry 606 may include amplification circuitry, e.g., a differential amplifier circuitry, analog-to-digital ("ADC") conversion circuitry, or otherwise. In some embodiments, the readout circuitry 606 may readout a row of image data at a time along readout column lines (illustrated) or may readout the image data using a variety of other techniques (not illustrated), such as a serial readout or a full parallel readout of all pixels simultaneously.

Function logic 608 may include logic and memory for storing the image data or even manipulating the image data by applying post image effects (e.g., crop, rotate, remove red eye, adjust brightness, adjust contrast, or otherwise).

Control circuitry 604 is coupled to pixels 610, and may include logic and memory for controlling operational characteristics of pixels 610. For example, control circuitry 604 may generate a shutter signal for controlling image acquisition. In one embodiment, the shutter signal is a global shutter signal for simultaneously enabling all pixels 610 to simultaneously capture their respective image data during a single acquisition window. In an alternative embodiment, the shutter signal is a rolling shutter signal whereby each row, column, or group of pixels 610 is sequentially enabled during consecutive acquisition windows.

FIG. 7-FIG. 13 illustrate one example of a representative method of manufacturing an image sensor 700 according to the teachings of the present disclosure, the image sensor 700 being substantively similar to the image sensor 200 of FIG. 2. Terms utilized with respect to this representative method and having common names with structural terms used to describe the representative image sensors of FIG. 2-FIG. 6 have common meanings with those terms. The representative method may include, or may be modified to include, one or more steps to impart one or more properties (e.g., dimensions) to structural elements, in accordance with the description of those elements provided above.

Figure 7:
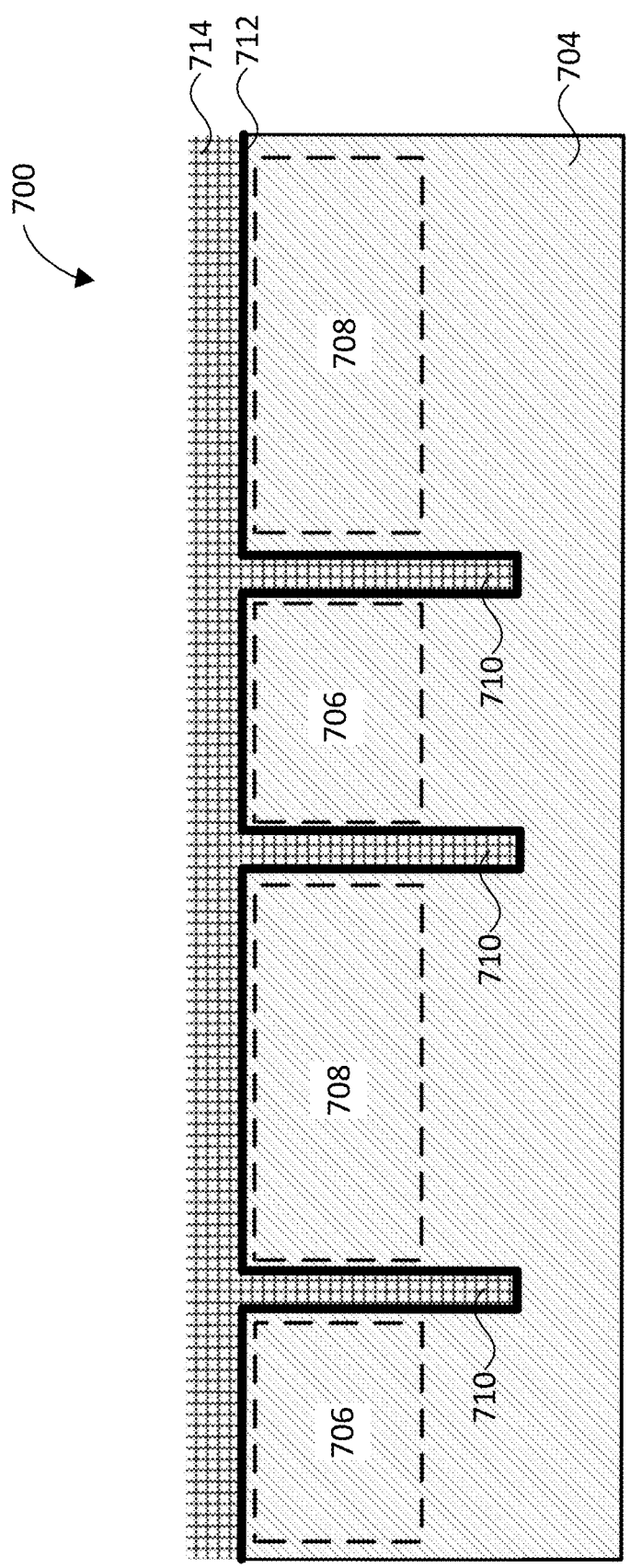
FIG. 7-FIG. 13 illustrate a representative method of manufacturing a representative image sensor in accordance with the teachings of the present disclosure.

Referring to FIG. 7, a substrate material 704 is provided. A plurality of small photodiodes (SPDs) (such as SPD 706) and plurality of large photodiodes (LPDs) (such as LPD 708) are formed in the substrate material 704, for example by ion implantation. The SPDs 706 and LPDs 708 are formed such that each LPD 708 has a first full well capacity that is larger than a second full well capacity of each SPD 706. A plurality of pixel isolators 710 are formed in the substrate material 704, each pixel isolator 710 being disposed between one of the SPDs 706 and one of the LPDs 708. In FIG. 7, each pixel isolator 710 is a deep trench isolation (DTI) trench structure. After forming the pixel isolators 710, a passivation layer 712 is formed on the substrate material, e.g., from a dielectric material. The passivation layer 712 is disposed in each pixel isolator 710 such that it extends between adjacent SPDs 706 and LPDs 708. After forming the passivation layer 712, a buffer layer 714 is formed on the passivation layer 712 to a thickness A, for example by dielectric deposition or thermal oxidation process. The passivation layer 712 is disposed in each pixel isolator 710 such that it extends between adjacent SPDs 706 and LPDs 708.

Figure 8:
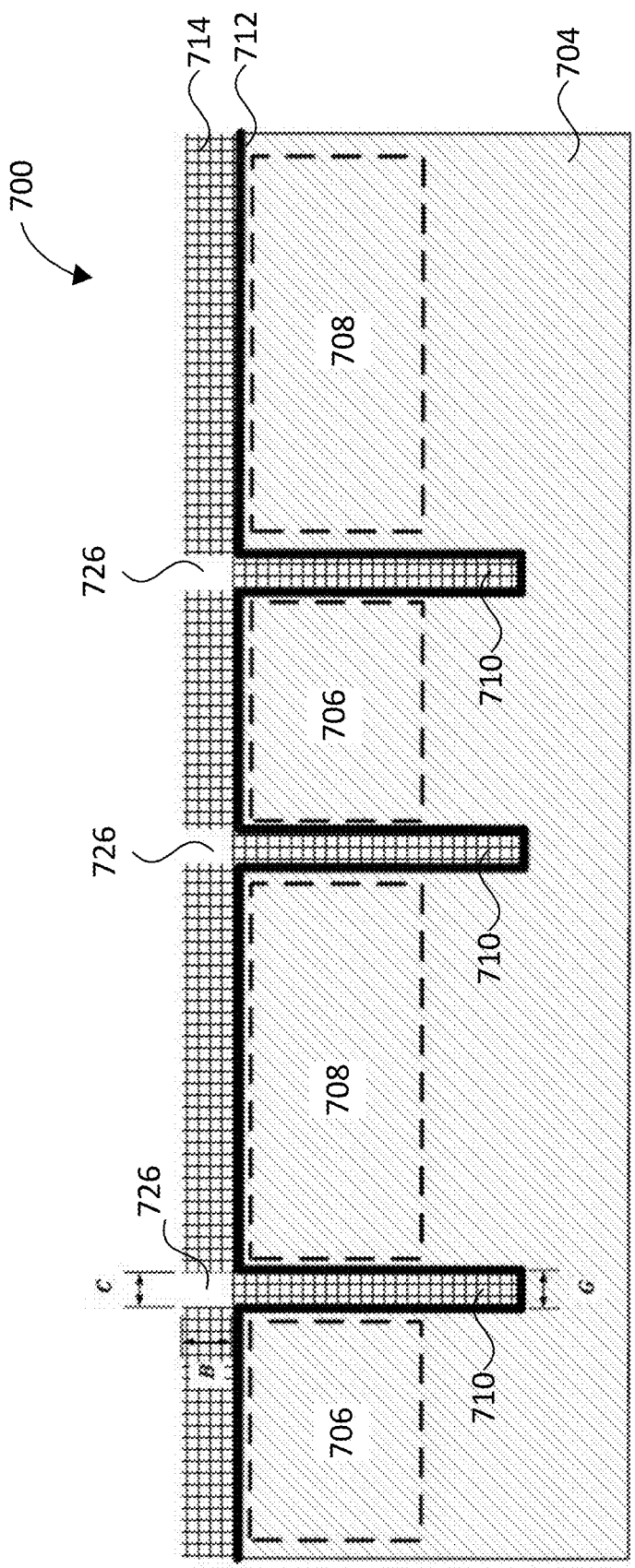

Referring to FIG. 8, the representative method further includes forming openings 726 in the buffer layer 714 by removing material from the buffer layer 714, such that each opening 726 has a thickness B and a width C, as described above. The thickness B may be less than a thickness of the buffer layer 714. The openings 726 may be formed by one or more lithography processes, etching processes, and/or the like. For example, a mask may be placed above the buffer layer 714 and then a dry etch process and a wet etch process may be used to remove material from the buffer layer 714 corresponding to the openings 726. For example, the dry etch process can be utilized to remove material from the buffer layer 714 down to a first depth that is less than an ultimate desired thickness B of the opening 726. The wet etch process can then be utilized to remove material from the buffer layer 714 down to the ultimate thickness B of the opening 726, e.g., in order to prevent damaging the passivation layer 712. In FIG. 8, each opening 726 is disposed directly over one of the pixel isolators 710. In some embodiments, each opening 726 may be shifted relative to the pixel isolators 710 in accordance with the teachings above. In some embodiments, each opening 726 has a thickness that is less than a thickness of the buffer layer 714, as described above, e.g., about 0.005 um to about 0.010 um less than the thickness of the buffer layer 214. In some embodiments, each opening 726 has a width C that is the same as or less than a width G of the pixel isolator 710 over which it is disposed. In some embodiments, each opening 726 has a width C of about 0.05 um to about 0.25 um.

Figure 9:
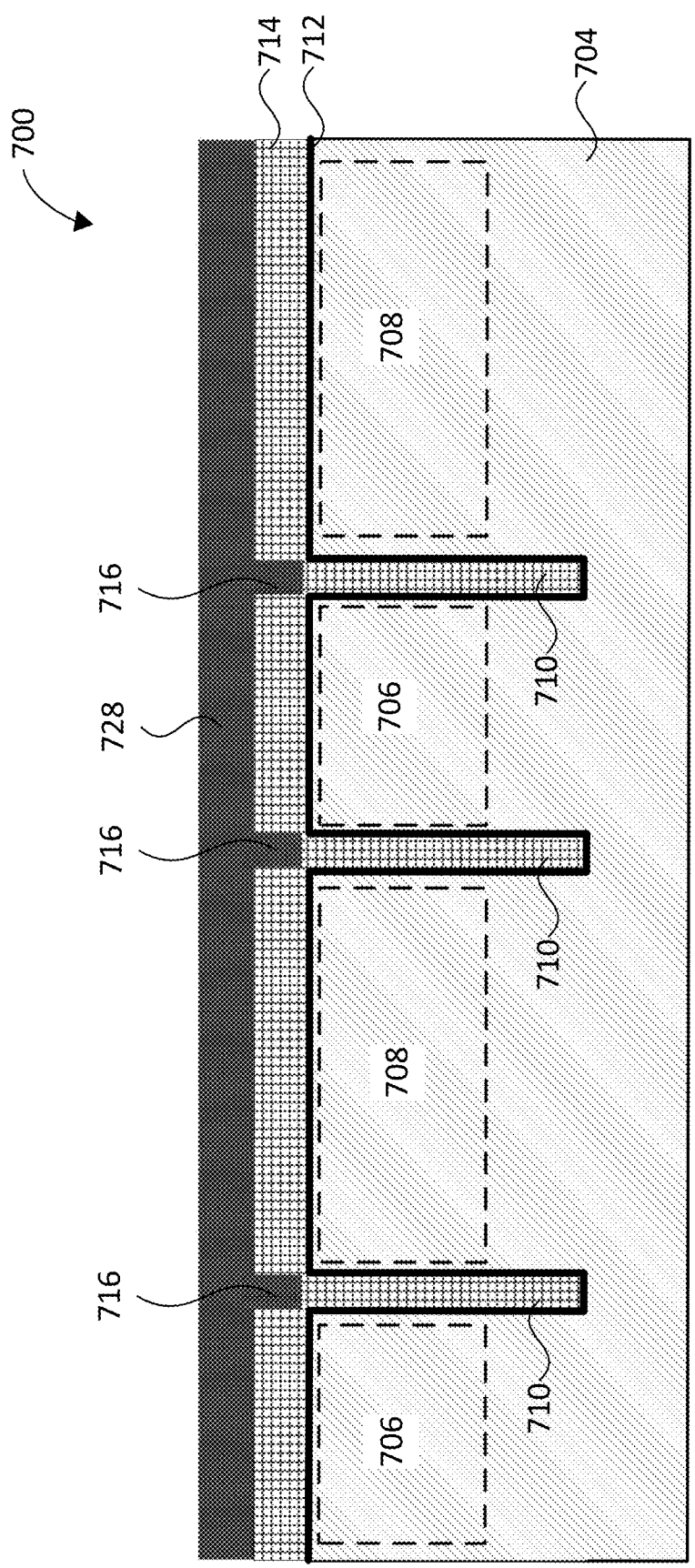

Referring to FIG. 9, the representative method further includes forming a plurality of first metal elements 716, including by depositing a first metal layer 728 (e.g., a layer of tungsten or aluminum) onto the buffer layer 714 such that the first metal layer 728 fills the openings previously formed in the buffer layer (i.e., the openings 726 shown in FIG. 8). In some embodiments, the first metal elements 716 are formed such that they do not contact the passivation layer 712, i.e., the openings 726 shown in FIG. 8 do not extend all the way down to the passivation layer 712. In this way, the buffer layer 714 isolates the first metal elements 716 from the passivation layer 712. Optionally, a barrier and adhesive layer may be deposited into the openings prior to the deposition of first metal layer 728 for preventing metal diffusion into semiconductor substrate 704 and increase bonding strength between the first metal layer 728 and the passivation layer 712. The barrier and adhesive layer may be patented and etched during the formation of first metal elements 716, such that a remaining portion of the barrier and adhesive layer formed between the first metal elements 716 and the passivation layer 712. The barrier and adhesive layer may include material such as titanium (Ti), titanium nitride (TiN) or the combination thereof.

Figure 10:
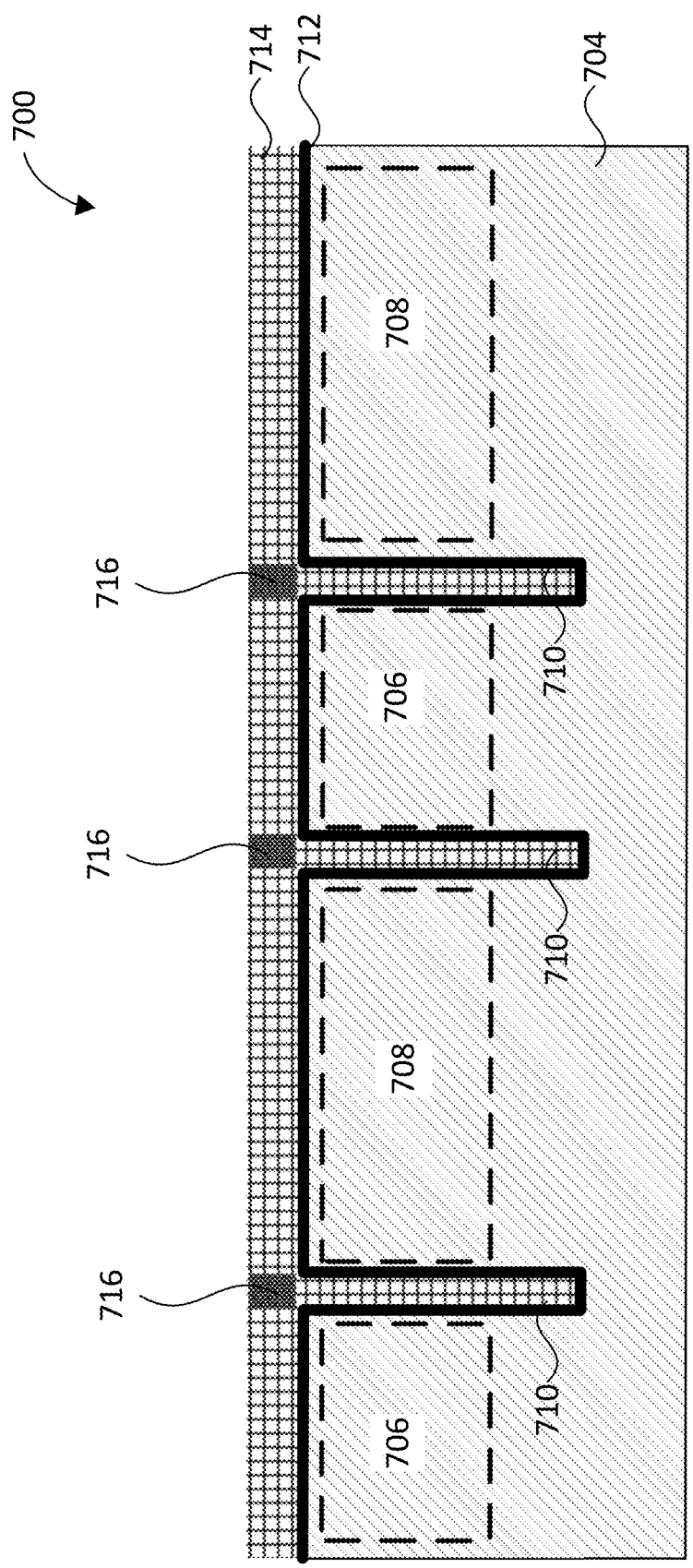

Referring to FIG. 10, the representative method further includes removing an excess portion of material from the first metal layer (i.e., where 628 points in FIG. 9) such that the first metal elements 716 remain in the openings previously formed in the buffer layer 714. In some embodiments, a polishing process (e.g., a chemical mechanical polishing process) is used to remove the excess portion of material from the first metal layer. Material is removed from the first metal layer until the buffer layer 714 is revealed and the first metal elements 716 are substantially all that remain of the first metal layer. Following this step, an upper surface of each first metal element 716 may be flush with an upper surface of the buffer layer 714.

Figure 11:
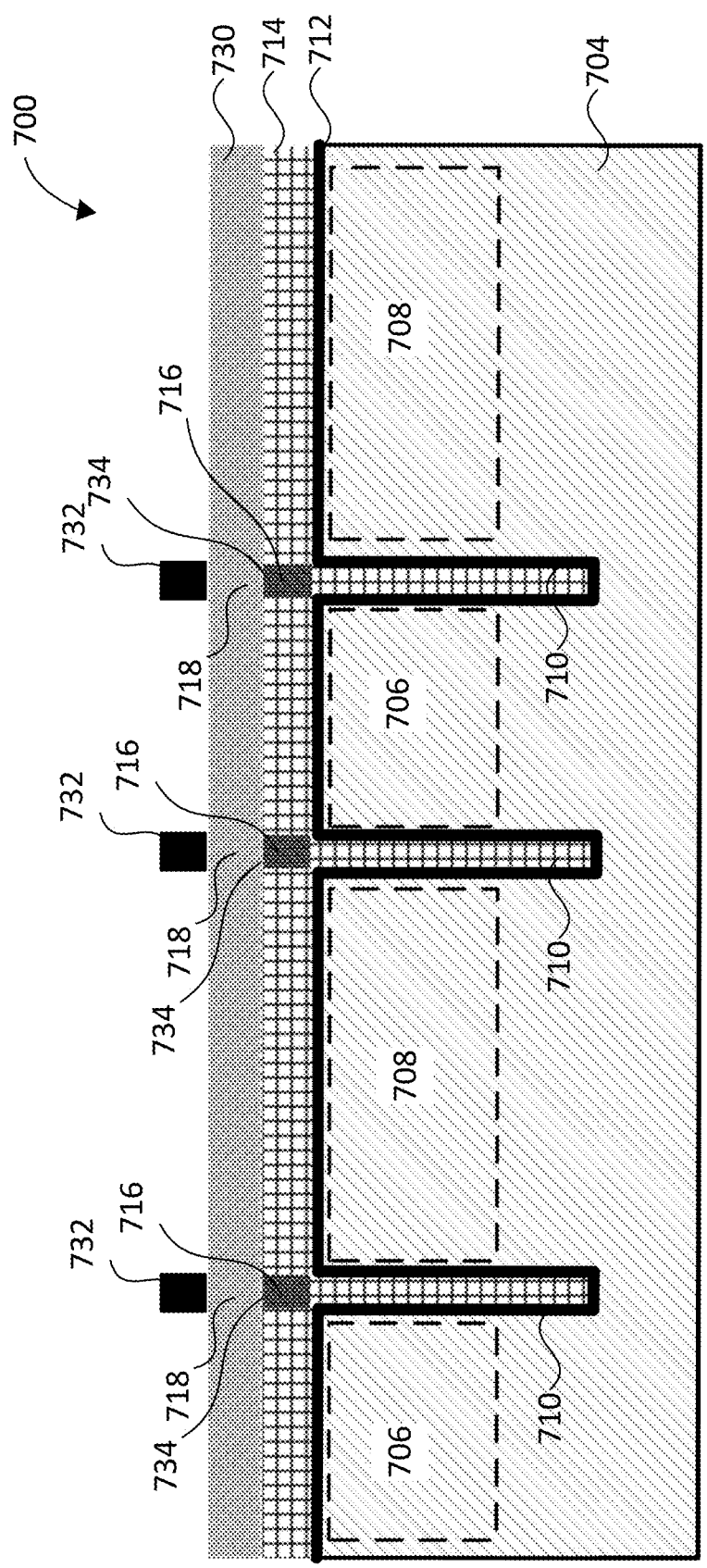

Referring to FIG. 11, the representative method further includes forming a plurality of second metal elements 718, including by initially depositing a second metal layer 730 (e.g., a tungsten or aluminum layer) over the first metal elements 716 and over the buffer layer 714. As a result of the deposition of second metal layer 730, a plurality of interfaces 734 are formed between the second metal layer 730 and the first metal elements 716. A mask 732 may be applied to the second metal layer 730 to cover portions of the second metal layer 730 that are not to be removed in a subsequent step. A lithography process may be utilized to form the mask 732.

Figure 12:
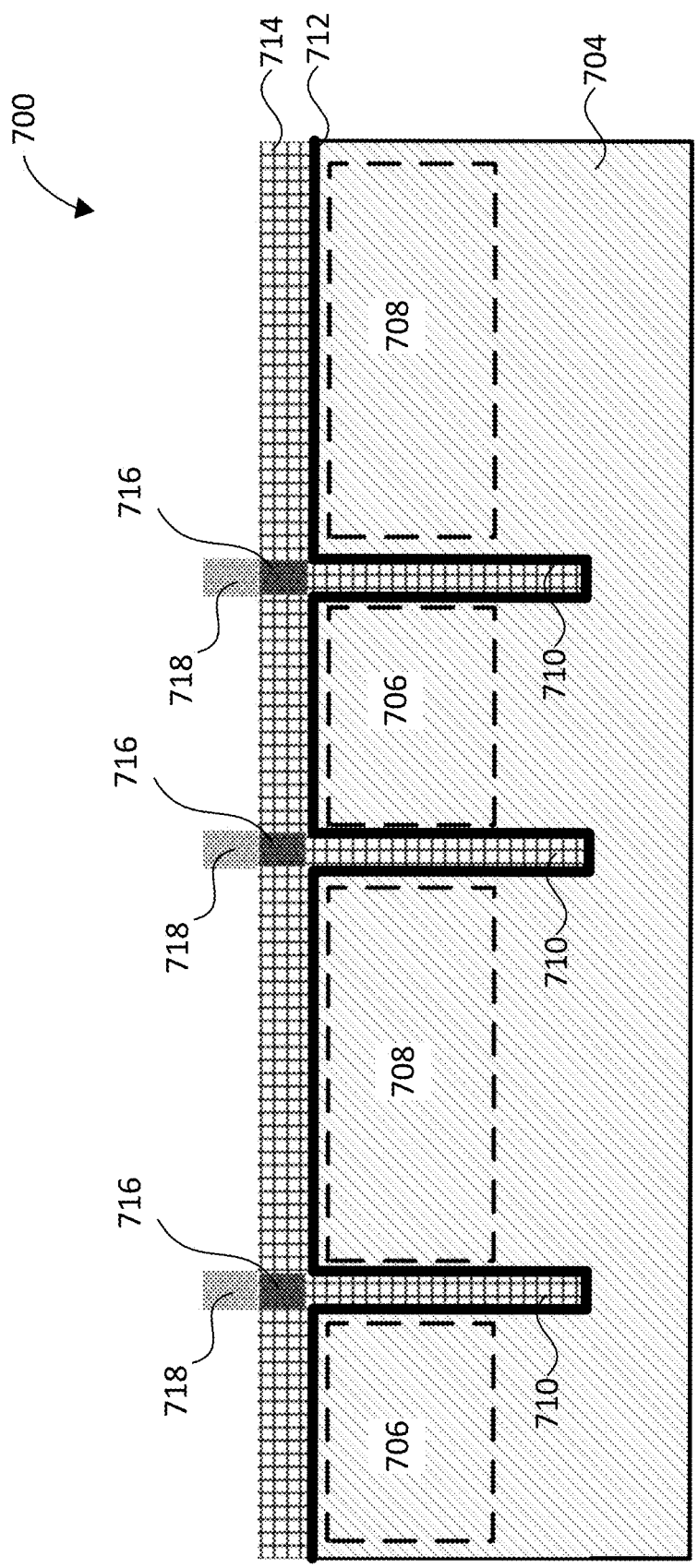

Referring to FIG. 12, the representative method further includes removing an excess portion(s) of material from the second metal layer (i.e., where 630 points in FIG. 11) in order to form the discrete second metal element 718 beneath the mask 732 shown in FIG. 11. An etching process may be utilized to remove material from the second metal layer. The excess portion(s) are located between adjacent first metal elements 716 and second metal elements 718. In FIG. 12, each of the second metal elements 718 is disposed directly over one of the first metal elements 716. In some embodiments, each second metal element 718 may be shifted relative to the first metal elements 716, such as shown in FIG. 3.

Figure 13:
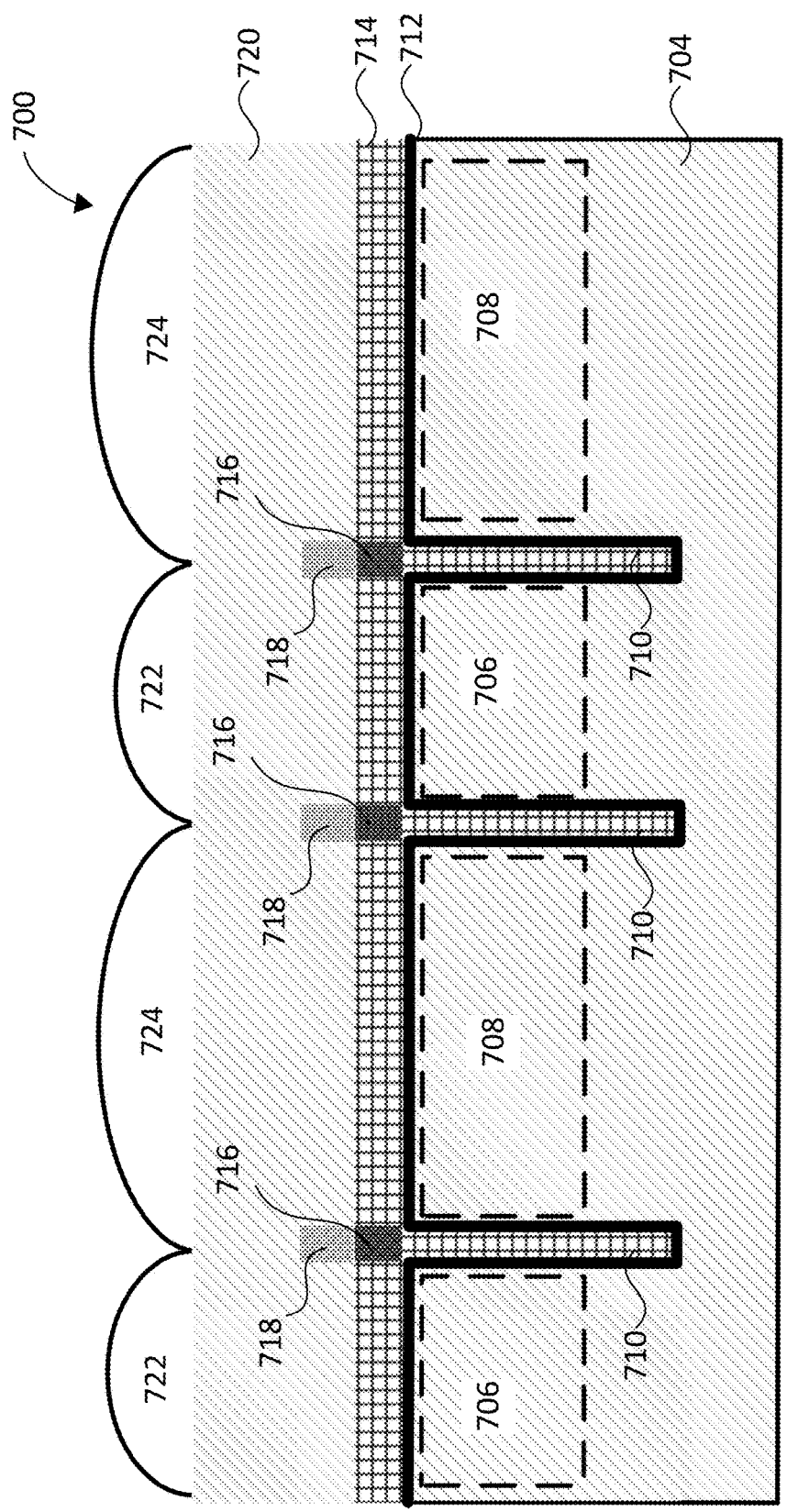

Referring to FIG. 13, the representative method further includes forming an optional color filter layer 720 upon the buffer layer 714, and forming an optional microlens array that includes small microlenses 722 and large microlenses 724. In FIG. 13, the color filter layer 720 is formed as a single layer disposed over and around the second metal elements 718. In some embodiments, color filter layer 720 includes an array of discrete color filters, e.g., small color filters and large color filters, one or more of which may be configured to filter a different wavelength of color than another color filter. In such embodiments, each discrete small color filter is disposed above and aligned an SPD 706. Likewise, each discrete large color filter is disposed above and aligned with an LPD 708. In some embodiments, adjacent color filters are disposed between adjacent second metal elements 718. In one example, individual color filters may be formed by deposition color filter materials in gaps between the second metal elements 718 according to color filter pattern such as Bayer pattern. In such example, each of the second metal elements 718 is arranged between individual color filters, and the grid formed from the second metal elements 718 surrounds individual color filters.

Thus, FIG. 7-FIG. 13 show one representative method of forming an image sensor of the present disclosure.

Figure 14:
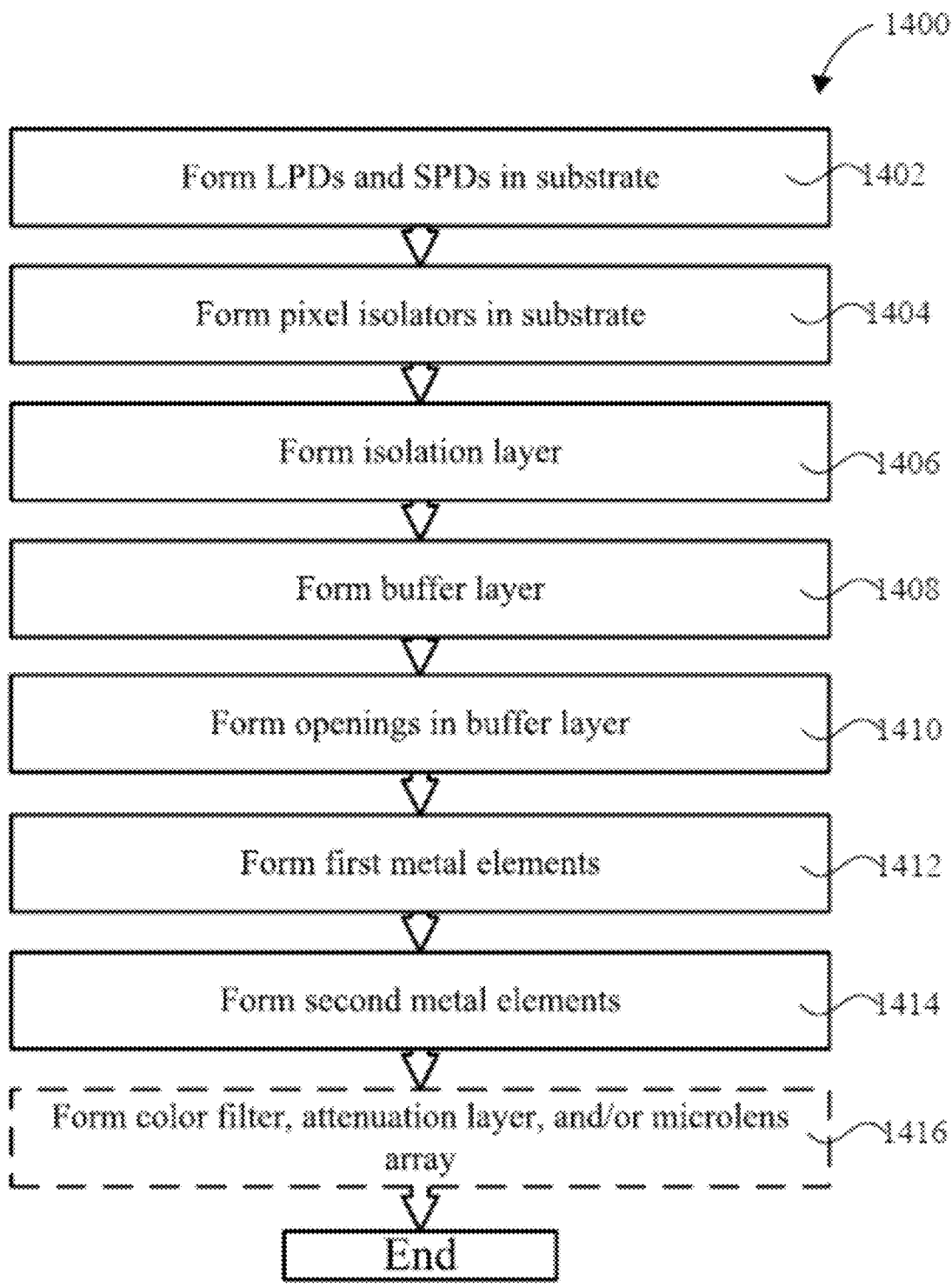
FIG. 14 illustrates a representative flow diagram of a method of manufacturing a representative image sensor in accordance with the teachings of the present disclosure.

FIG. 14 is a flow chart of a representative method 1400 that summarizes the method of FIG. 7-FIG. 13. Although the following description refers to a number of discrete steps, the actions described may be performed within a greater or fewer number of steps.

At step 1402, a semiconductor substrate material is provided and a plurality of LPDs and SPDs are formed therein, as described above with respect to FIG. 7.

At step 1404, a plurality of pixel isolators is formed in the substrate material between the LPDs and the SPDs, as described above with respect to FIG. 7.

At step 1406, a passivation layer is formed upon the substrate material and in the pixel isolators, as described above with respect to FIG. 7. For example, the passivation layer may line the sidewalls and bottoms of trench structure of each individual pixel isolator and continuously extend on the back side of the substrate material covering back side surface.

At step 1408, a buffer layer is formed upon the passivation layer, as described above with respect to FIG. 7

At step 1410, a plurality of openings is formed in the buffer layer, as described above with respect to FIG. 8.

At step 1412, a plurality of first metal elements are formed in the buffer layer, as described above with respect to FIG. 8-FIG. 10.

At step 1414, a plurality of second metal elements are formed, as described above with respect to FIG. 11-FIG. 12.

At optional step 1416, an attenuation layer covering SPDs, a color filter (e.g., a color filter array) and a microlens array are formed upon the buffer layer and upon the second metal elements, as described above with respect to FIG. 13.

Terms utilized with respect to the foregoing representative method and having common names with structural terms used to describe the representative image sensors of FIG. 2-FIG. 5 and the representative method of FIG. 7-FIG. 13 have common meanings with those terms. The representative method may include, or may be modified to include, one or more steps to impart one or more properties (e.g., dimensions) to structural elements, in accordance with the description of those elements provided above.

Thus, image sensors of the present disclosure have a metal grid comprising first metal elements disposed in a buffer layer, and second metal elements disposed on the first metal elements. The first metal elements and the second metal elements form a metal grid configured to reduce the amount of high angle incident light entering the small photodiodes from the proximate large photodiodes, i.e., reducing optical crosstalk and its associated effects (e.g., petal flare).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

Modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a substrate material, wherein the substrate material includes a plurality of small photodiodes (SPDs) and a plurality of large photodiodes (LPDs) disposed therein, each LPD having a first full well capacity that is larger than a second full well capacity of each SPD;
   a plurality of pixel isolators formed in the substrate material, each pixel isolator being disposed between one of the SPDs and one of the LPDs;
   a passivation layer disposed on the substrate material;
   a buffer layer disposed on the passivation layer;
   a plurality of first metal elements disposed in the buffer layer, each first metal element being disposed over one of the pixel isolators;
   a plurality of second metal elements disposed over the plurality of first metal elements; and
   a plurality of color filters, wherein each color filter of the plurality of color filters is disposed between the second metal elements of the plurality of second metal elements, such that the plurality of second metal elements surround the plurality of color filters.

2. The image sensor of claim 1, wherein the plurality of first metal elements has a thickness of 0.005 um to 0.010 um less than a thickness of the buffer layer, such that the buffer layer isolates the plurality of first metal elements from the passivation layer.

3. The image sensor of claim 1, wherein the buffer layer has a first dielectric constant and the passivation layer has a second dielectric constant, wherein the first dielectric constant is lower than the second dielectric constant.

4. The image sensor of claim 2, wherein an upper surface of the plurality of first metal elements is flush with an upper surface of the buffer layer.

5. The image sensor of claim 1, wherein each first metal element has a width of 0.05 um to 0.25 um.

6. The image sensor of claim 5, wherein each first metal element has a width of 0.09 um to 0.20 um.

7. The image sensor of claim 5, wherein the width of each first metal element is the same as or less than a width of the pixel isolator over which it is disposed.

8. The image sensor of claim 1, wherein the plurality of second metal elements has a thickness of 0.10 um to 0.50 um.

9. The image sensor of claim 1, wherein each second metal element has a greater thickness than each first metal element.

10. The image sensor of claim 1, where the plurality of first metal elements is shifted relative to the plurality of second metal elements.

11. The image sensor of claim 1, wherein at least one of the plurality of first metal elements or one of the plurality of second metal elements is formed from tungsten or aluminum.

12. The image sensor of claim 1, further comprising:
   a plurality small microlenses, each small microlens being positioned over one of the SPDs; and a plurality large microlenses, each large microlens being positioned over one of the LPDs.

13. The image sensor of claim 1, further comprising an attenuation layer disposed at least partially over the plurality of second metal elements formed in the buffer layer.

14. The image sensor of claim 1, wherein at least one of the plurality of first metal elements and the plurality of second metal elements forms a grid.

* * * * *

UNITED STATES PATENT AND TRADEMARK OFFICE
CERTIFICATE OF CORRECTION

PATENT NO. : 11,329,086 B2
APPLICATION NO. : 16/729176
DATED : May 10, 2022
INVENTOR(S) : Y. Liu et al.

Page 1 of 1

It is certified that error appears in the above-identified patent and that said Letters Patent is hereby corrected as shown below:

In the Claims

| Column | Line | |
|---|---|---|
| 14 | 66 | change "plurality" to -- plurality of --. |
| 15 | 1 | change "plurality" to -- plurality of --. |

Signed and Sealed this
Eighth Day of August, 2023

Katherine Kelly Vidal
*Director of the United States Patent and Trademark Office*